(12) United States Patent
Folkmann et al.

(10) Patent No.: US 9,813,036 B2
(45) Date of Patent: Nov. 7, 2017

(54) DYNAMIC LOADLINE POWER AMPLIFIER WITH BASEBAND LINEARIZATION

(71) Applicant: RF Micro Devices, Inc., Greensboro, NC (US)

(72) Inventors: Andrew F. Folkmann, Cedar Rapids, IA (US); Ramon Antonio Beltran Lizarraga, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 13/714,600

(22) Filed: Dec. 14, 2012

(65) Prior Publication Data

US 2013/0154729 A1 Jun. 20, 2013

Related U.S. Application Data

(60) Provisional application No. 61/576,520, filed on Dec. 16, 2011.

(51) Int. Cl.
| | | |
|---|---|---|
| *H03G 3/20* | (2006.01) | |
| *H03F 3/189* | (2006.01) | |
| *H03F 3/68* | (2006.01) | |
| *H03F 1/02* | (2006.01) | |
| *H03F 3/72* | (2006.01) | |
| *H03G 3/30* | (2006.01) | |

(52) U.S. Cl.
CPC ............. *H03G 3/20* (2013.01); *H03F 1/0288* (2013.01); *H03F 3/189* (2013.01); *H03F 3/68* (2013.01); *H03F 3/72* (2013.01); *H03G 3/3042* (2013.01)

(58) Field of Classification Search
USPC ................... 330/124 R, 295, 84, 286, 53–54
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |

(Continued)

FOREIGN PATENT DOCUMENTS

| | | |
|---|---|---|
| CN | 1076567 A | 9/1993 |
| CN | 1211355 A | 3/1999 |

(Continued)

OTHER PUBLICATIONS

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

(Continued)

*Primary Examiner* — Hieu Nguyen
(74) *Attorney, Agent, or Firm* — Withrow & Terranova, P.L.L.C.

(57) ABSTRACT

Radio frequency (RF) amplification devices and methods of amplifying RF signals are disclosed. In one embodiment, an RF amplification device includes a control circuit and a Doherty amplifier configured to amplify an RF signal. The Doherty amplifier includes a main RF amplification circuit and a peaking RF amplification circuit. The control circuit is configured to activate the peaking RF amplification circuit in response to the RF signal reaching a threshold level. In this manner, the activation of the peaking RF amplification circuit can be precisely controlled.

17 Claims, 9 Drawing Sheets

(56) References Cited

U.S. PATENT DOCUMENTS

| | | |
|---|---|---|
| 4,131,860 A | 12/1978 | Fyot |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tidemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,725,021 B1 | 4/2004 | Anderson et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,026,868 B2 | 4/2006 | Robinson et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,064,606 B2* | 6/2006 | Louis ............... H03F 1/0266 330/124 R |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,391,190 B1 | 6/2008 | Rajagopalan |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2* | 5/2012 | Grondahl ............... 330/295 |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2* | 9/2012 | Cho et al. ............... 330/295 |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,364,101 B2* | 1/2013 | Shizawa ............... H03F 1/0222 375/297 |

(56) References Cited

U.S. PATENT DOCUMENTS

| | | |
|---|---|---|
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,643,435 B2 | 2/2014 | Lim et al. |
| 8,648,657 B1 | 2/2014 | Rozenblit |
| 8,659,355 B2 * | 2/2014 | Henshaw et al. ............ 330/127 |
| 8,692,527 B2 | 4/2014 | Ritamaki et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,088,247 B2 | 7/2015 | Amo et al. |
| 9,099,961 B2 | 8/2015 | Kay et al. |
| 9,112,452 B1 | 8/2015 | Khlat |
| 9,491,314 B2 | 11/2016 | Wimpenny |
| 9,628,025 B2 | 4/2017 | Wimpenny |
| 2002/0071497 A1 | 6/2002 | Bengtsson et al. |
| 2002/0125869 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0015229 A1 | 1/2009 | Kotikalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |

(56) References Cited

U.S. PATENT DOCUMENTS

| | | |
|---|---|---|
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0237948 A1 | 9/2010 | Nguyen et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049818 A1 | 3/2012 | Hester |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0139641 A1 | 6/2012 | Kaczman et al. |
| 2012/0146731 A1 | 6/2012 | Khesbak |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0034139 A1 | 2/2013 | Khlat et al. |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0127548 A1 | 5/2013 | Popplewell et al. |
| 2013/0134956 A1 | 5/2013 | Khlat |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0169245 A1 | 7/2013 | Kay et al. |
| 2013/0176076 A1 | 7/2013 | Riehl |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0231069 A1 | 9/2013 | Drogi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184334 A1 | 7/2014 | Nobbe et al. |
| 2014/0184335 A1 | 7/2014 | Nobbe et al. |
| 2014/0184337 A1 | 7/2014 | Nobbe et al. |
| 2014/0203868 A1 | 7/2014 | Khlat et al. |
| 2014/0203869 A1 | 7/2014 | Khlat et al. |
| 2014/0218109 A1 | 8/2014 | Wimpenny |
| 2014/0225674 A1 | 8/2014 | Folkmann et al. |
| 2014/0232458 A1 | 8/2014 | Amo et al. |
| 2014/0266427 A1 | 9/2014 | Chiron |
| 2014/0266428 A1 | 9/2014 | Chiron et al. |
| 2014/0266462 A1 | 9/2014 | Schirmann et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0054588 A1 | 2/2015 | Wimpenny |
| 2015/0097624 A1 | 4/2015 | Olson et al. |
| 2015/0123733 A1 | 5/2015 | Wimpenny et al. |
| 2015/0180422 A1 | 6/2015 | Khlat et al. |
| 2015/0234402 A1 | 8/2015 | Kay et al. |
| 2015/0270806 A1 | 9/2015 | Wagh et al. |
| 2015/0333781 A1 | 11/2015 | Alon et al. |
| 2016/0380597 A1 | 12/2016 | Midya |

FOREIGN PATENT DOCUMENTS

| | | |
|---|---|---|
| CN | 1518209 A | 8/2004 |
| CN | 1592089 A | 3/2005 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| CN | 102403967 A | 4/2012 |
| EP | 0755121 A2 | 1/1996 |
| EP | 1047188 A2 | 10/2000 |
| EP | 1317105 A1 | 6/2003 |

(56) References Cited

FOREIGN PATENT DOCUMENTS

| | | |
|---|---|---|
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Yousefzadeh, Vahid et al., "Band Separation and Efficiency Optimization in Linear-Assisted Switching Power Amplifiers," 37th IEEE Power Electronics Specialists Conference, Jun. 18-22, 2006, 7 pages.

International Preliminary Report on Patentability for PCT/US2012/040317, dated Dec. 12, 2013, 5 pages.

Notice of Allowance for U.S. Appl. No. 13/531,719, dated Dec. 30, 2013, 7 pages.

Non-Final Office Action for U.S. Appl. No. 13/550,049, dated Nov. 25, 2013, 6 pages.

Non-Final Office Action for U.S. Appl. No. 14/022,940, dated Dec. 20, 2013, 5 pages.

International Search Report and Written Opinion for PCT/US2013/052277, dated Jan. 7, 2014, 14 pages.

Notice of Allowance for U.S. Appl. No. 13/297,490, dated Feb. 27, 2014, 7 pages.

Non-Final Office Action for U.S. Appl. No. 13/297,470, dated Feb. 20, 2014, 16 pages.

Notice of Allowance for U.S. Appl. No. 13/550,049, dated Mar. 6, 2014, 5 pages.

International Preliminary Report on Patentability for PCT/US2012/046887, dated Jan. 30, 2014, 8 pages.

International Preliminary Report on Patentability for PCT/US2012/053654, dated Mar. 13, 2014, 7 pages.

Non-Final Office Action for U.S. Appl. No. 13/661,552, dated Feb. 21, 2014, 5 pages.

International Search Report and Written Opinion for PCT/US2013/065403, dated Feb. 5, 2014, 11 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.

Dixon, N., "Standardisation Boosts Momentum for Envelope Tracking," Microwave Engineers, Europe, Apr. 20, 2011, 2 pages, http://www.mwee.com/en/standardisation-boosts-momentum-for-envelope-tracking.html?cmp_ids=71&news_ids=222901746.

Hekkala, A. et al., "Adaptive Time Misalignment Compensation in Envelope Tracking Amplifiers," International Symposium on Spread Spectrum Techniques and Applications, Aug. 2008, pp. 761-765.

Kim et al., "High Efficiency and Wideband Envelope Tracking Power Amplifiers with Sweet Spot Tracking," 2010 IEEE Radio Frequency Integrated Circuits Symposium, May 5-7, 2010, pp. 255-258.

Kim, N. et al, "Ripple Feedback Filter Suitable for Analog/Digital Mixed-Mode Audio Amplifier for Improved Efficiency and Stability," Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering $0.55W/mm^2$ at 81% Efficiency," 2010 IEEE International Solid State Circuits Conference, Feb. 20-24, 2010, pp. 210-212.

Li et al., "A Highly Efficient SiGe Differential Power Amplifier Using an Envelope-Tracking Technique for 3GPP LTE Applications," IEEE Bipolar/BiCMOS Circuits and Technology Meeting (BCTM), Oct. 4-6, 2010, pp. 121-124.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira Files 100th Envelope Tracking Patent," CS: Compound Semiconductor, Apr. 11, 2011, 1 page.

Non-final Office Action for U.S. Appl. No. 11/113,873, now U.S. Pat. No. 7,773,691, dated Feb. 1, 2008, 17 pages.

Final Office Action for U.S. Appl. No. 11/113,873, now U.S. Pat. No. 7,773,691, dated Jul. 30, 2008, 19 pages.

Non-final Office Action for U.S. Appl. No. 11/113,873, now U.S. Pat. No. 7,773,691, dated Nov. 26, 2008, 22 pages.

Final Office Action for U.S. Appl. No. 11/113,873, now U.S. Pat. No. 7,773,691, dated May 4, 2009, 20 pages.

Non-final Office Action for U.S. Appl. No. 11/113,873, now U.S. Pat. No. 7,773,691, dated Feb. 3, 2010, 21 pages.

Notice of Allowance for U.S. Appl. No. 11/113,873, now U.S. Pat. No. 7,773,691, dated Jun. 9, 2010, 7 pages.

International Search Report for PCT/US06/12619 dated May 8, 2007, 2 pages.

Extended European Search Report for application 06740532.4 dated Dec. 7, 2010, 7 pages.

Non-final Office Action for U.S. Appl. No. 12/112,006 dated Apr. 5, 2010, 6 pages.

Notice of Allowance for U.S. Appl. No. 12/112,006 dated Jul. 19, 2010, 6 pages.

Non-final Office Action for U.S. Appl. No. 13/089,917 dated Nov. 23, 2012, 6 pages.

International Search Report for PCT/US11/033037, dated Aug. 9, 2011, 10 pages.

International Preliminary Report on Patentability for PCT/US2011/033037 dated Oct. 23, 2012, 7 pages.

Non-Final Office Action for U.S. Appl. No. 13/188,024, dated Feb. 5, 2013, 8 pages.

International Search Report for PCT/US2011/044857, dated Oct. 24, 2011, 10 pages.

International Preliminary Report on Patentability for PCT/US2011/044857 dated Mar. 7, 2013, 6 pages.

Non-final Office Action for U.S. Appl. No. 13/218,400 dated Nov. 8, 2012, 7 pages.

Notice of Allowance for U.S. Appl. No. 13/218,400 dated Apr. 11, 2013, 7 pages.

International Search Report for PCT/US11/49243, dated Dec. 22, 2011, 9 pages.

International Preliminary Report on Patentability for PCT/US11/49243 dated Nov. 13, 2012, 33 pages.

International Search Report for PCT/US2011/054106 dated Feb. 9, 2012, 11 pages.

International Search Report for PCT/US2011/061007 dated Aug. 16, 2012, 16 pages.

Non-Final Office Action for U.S. Appl. No. 13/297,470 dated May 8, 2013, 15 pages.

(56) References Cited

OTHER PUBLICATIONS

International Search Report for PCT/US2011/061009 dated Feb. 8, 2012, 14 pages.
International Search Report for PCT/US2012/023495 dated May 7, 2012, 13 pages.
Non-final Office Action for U.S. Appl. No. 13/222,453 dated Dec. 6, 2012, 13 pages.
Notice of Allowance for U.S. Appl. No. 13/222,453 dated Feb. 21, 2013, 7 pages.
Invitation to Pay Additional Fees and Where Applicable Protest Fee for PCT/US2012/024124 dated Jun. 1, 2012, 7 pages.
International Search Report for PCT/US2012/024124 dated Aug. 24, 2012, 14 pages.
Notice of Allowance for U.S. Appl. No. 13/316,229 dated Nov. 14, 2012, 9 pages.
International Search Report for PCT/US2011/064255 dated Apr. 3, 2012, 12 pages.
International Search Report for PCT/US2012/40317 dated Sep. 7, 2012, 7 pages.
International Search Report for PCT/US2012/046887 dated Dec. 21, 2012, 12 pages.
Non-final Office Action for U.S. Appl. No. 13/222,484 dated Nov. 8, 2012, 9 pages.
Final Office Action for U.S. Appl. No. 13/222,484 dated Apr. 10, 2013, 10 pages.
International Search Report and Written Opinion for PCT/US2012/053654 dated Feb. 15, 2013, 11 pages.
International Search Report and Written Opinion for PCT/US2012/062070, dated Jan. 21, 2013, 12 pages.
International Search Report and Written Opinion for PCT/US2012/067230 dated Feb. 21, 2013, 10 pages.
Notice of Allowance for U.S. Appl. No. 13/188,024, dated Jun. 18, 2013, 7 pages.
International Preliminary Report on Patentability for PCT/US2011/054106 dated Apr. 11, 2013, 8 pages.
International Preliminary Report on Patentability for PCT/US2011/061007 dated May 30, 2013, 11 pages.
International Preliminary Report on Patentability for PCT/US2011/061009 dated May 30, 2013, 10 pages.
Non-Final Office Action for U.S. Appl. No. 13/423,649, dated May 22, 2013, 7 pages.
Advisory Action for U.S. Appl. No. 13/222,484, dated Jun. 14, 2013, 3 pages.
International Preliminary Report on Patentability for PCT/US2011/064255, dated Jun. 20, 2013, 7 pages.
Notice of Allowance for U.S. Appl. No. 13/343,840, dated Jul. 1, 2013, 8 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, dated Jul. 18, 2013, 9 pages.
Notice of Allowance for U.S. Appl. No. 13/222,453, dated Aug. 22, 2013, 8 pages.
Non-Final Office Action for U.S. Appl. No. 13/367,973, dated Sep. 24, 2013, 8 pages.
Notice of Allowance for U.S. Appl. No. 13/423,649, dated Aug. 30, 2013, 8 pages.
Notice of Allowance for U.S. Appl. No. 13/316,229, dated Aug. 29, 2013, 8 pages.
Quayle Action for U.S. Appl. No. 13/531,719, dated Oct. 10, 2013, 5 pages.
Notice of Allowance for U.S. Appl. No. 13/550,060, dated Aug. 16, 2013, 8 pages.
Notice of Allowance for U.S. Appl. No. 13/222,484, dated Aug. 26, 2013, 8 pages.
Notice of Allowance for U.S. Appl. No. 13/602,856, dated Sep. 24, 2013, 9 pages.
International Preliminary Report on Patentability for PCT/US2012/024124, dated Aug. 22, 2013, 8 pages.
International Preliminary Report on Patentability for PCT/US2012/023495, dated Aug. 15, 2013, 10 pages.
Notice of Allowance for U.S. Appl. No. 14/022,858, dated Oct. 25, 2013, 9 pages.
Non-Final Office Action for U.S. Appl. No. 12/836,307, dated Nov. 5, 2013, 6 pages.
Examination Report for European Patent Application No. 11720630.0, dated Aug. 16, 2013, 5 pages.
Final Office Action for U.S. Appl. No. 13/297,470, dated Oct. 25, 2013, 17 pages.
Extended European Search Report for European Patent Application No. 12794149.0, dated Oct. 29, 2014, 6 pages.
International Search Report and Written Opinion for PCT/US2014/012927, dated Sep. 30, 2014, 11 pages.
International Search Report and Written Opinion for PCT/US2014/028178, dated Sep. 30, 2014, 17 pages.
First Office Action for Chinese Patent Application No. 201280026559.0, dated Nov. 3, 2014, 14 pages (with English translation).
Notice of Allowance for U.S. Appl. No. 14/072,140, dated Aug. 27, 2014, 8 pages.
Non-Final Office Action for U.S. Appl. No. 14/072,225, dated Aug. 15, 2014, 4 pages.
Notice of Allowance for U.S. Appl. No. 13/548,283, dated Sep. 3, 2014, 7 pages.
Non-Final Office Action for U.S. Appl. No. 13/689,883, dated Aug. 27, 2014, 12 pages.
Notice of Allowance for U.S. Appl. No. 13/690,187, dated Sep. 3, 2014, 9 pages.
Non-Final Office Action for U.S. Appl. No. 13/782,142, dated Sep. 4, 2014, 6 pages.
European Search Report for Patent Application No. 14162682.0, dated Aug. 27, 2014, 7 pages.
Invitation to Pay Additional Fees and Partial International Search Report for PCT/US2014/028178, dated Jul. 24, 2014, 7 pages.
Non-Final Office Action for U.S. Appl. No. 12/836,307, dated Sep. 25, 2014, 5 pages.
Advisory Action for U.S. Appl. No. 13/297,470, dated Sep. 19, 2014, 3 pages.
Non-Final Office Action for U.S. Appl. No. 13/297,470, dated Oct. 20, 2014, 22 pages.
Notice of Allowance for U.S. Appl. No. 13/367,973, dated Sep. 15, 2014, 7 pages.
Notice of Allowance for U.S. Appl. No. 13/647,815, dated Sep. 19, 2014, 6 pages.
Non-Final Office Action for U.S. Appl. No. 13/661,227, dated Sep. 29, 2014, 24 pages.
Notice of Allowance for U.S. Appl. No. 13/684,826, dated Sep. 8, 2014, 6 pages.
Notice of Allowance for U.S. Appl. No. 13/914,888, dated Oct. 17, 2014, 10 pages.
Non-Final Office Action for U.S. Appl. No. 13/747,725, dated Oct. 7, 2014, 6 pages.
Notice of Allowance for U.S. Appl. No. 14/072,140, dated Dec. 2, 2014, 8 pages.
Notice of Allowance for U.S. Appl. No. 13/486,012, dated Nov. 21, 2014, 8 pages.
Final Office Action for U.S. Appl. No. 13/689,883, dated Jan. 2, 2015, 13 pages.
Notice of Allowance for U.S. Appl. No. 13/690,187, dated Dec. 19, 2014, 8 pages.
Notice of Allowance for U.S. Appl. No. 13/747,694, dated Dec. 22, 2014, 9 pages.
Notice of Allowance for U.S. Appl. No. 13/951,976, dated Dec. 26, 2014, 9 pages.
Non-Final Office Action for U.S. Appl. No. 13/747,749, dated Nov. 12, 2014, 32 pages.

(56) References Cited

OTHER PUBLICATIONS

European Search Report for European Patent Application No. 14190851.7, dated Mar. 5, 2015, 6 pages.
First Office Action for Chinese Patent Application No. 201180030273.5, dated Dec. 3, 2014, 15 pages (with English translation).
International Preliminary Report on Patentability for PCT/US2013/052277, dated Feb. 5, 2015, 9 pages.
Notice of Allowance for U.S. Appl. No. 13/948,291, dated Feb. 11, 2015, 7 pages.
Notice of Allowance for U.S. Appl. No. 14/022,858, dated Feb. 17, 2015, 7 pages.
Notice of Allowance for U.S. Appl. No. 14/072,225, dated Jan. 22, 2015, 7 pages.
Final Office Action for U.S. Appl. No. 13/661,227, dated Feb. 6, 2015, 24 pages.
Non-Final Office Action for U.S. Appl. No. 14/048,109, dated Feb. 18, 2015, 8 pages.
Notice of Allowance for U.S. Appl. No. 13/747,725, dated Feb. 2, 2015, 10 pages.
Notice of Allowance for U.S. Appl. No. 12/836,307, dated Mar. 2, 2015, 6 pages.
Notice of Allowance for U.S. Appl. No. 13/297,470, dated Feb. 25, 2015, 15 pages.
Corrected Notice of Allowance for U.S. Appl. No. 13/297,470, dated Apr. 6, 2015, 11 pages.
Non-Final Office Action for U.S. Appl. No. 14/122,852, dated Feb. 27, 2015, 5 pages.
Non-Final Office Action for U.S. Appl. No. 14/056,292, dated Mar. 6, 2015, 8 pages.
Final Office Action for U.S. Appl. No. 13/747,749, dated Mar. 20, 2015, 35 pages.
Non-Final Office Action for U.S. Appl. No. 14/072,120, dated Apr. 14, 2015, 8 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, dated Jul. 17, 2015, 8 pages.
Second Office Action for Chinese Patent Application No. 201180030273.5, dated Aug. 14, 2015, 8 pages.
European Examination Report for European Patent Application No. 14162682.0, dated May 22, 2015, 5 pages.
Corrected Notice of Allowance for U.S. Appl. No. 13/297,470, dated Jun. 5, 2015, 11 pages.
Notice of Allowance for U.S. Appl. No. 14/072,140, dated Aug. 20, 2015, 6 pages.
Non-Final Office Action for U.S. Appl. No. 14/072,225, dated Aug. 18, 2015, 4 pages.
Advisory Action for U.S. Appl. No. 13/689,883, dated Apr. 20, 2015, 3 pages.
Non-Final Office Action for U.S. Appl. No. 13/689,883, dated Jul. 24, 2015, 13 pages.
Advisory Action for U.S. Appl. No. 13/661,227, dated May 12, 2015, 3 pages.
Non-Final Office Action for U.S. Appl. No. 13/661,227, dated Jul. 27, 2015, 25 pages.
Notice of Allowance for U.S. Appl. No. 14/212,154, dated Jul. 17, 2015, 8 pages.
Notice of Allowance for U.S. Appl. No. 14/212,199, dated Jul. 20, 2015, 8 pages.
Notice of Allowance for U.S. Appl. No. 13/747,725, dated May 13, 2015, 9 pages.
Notice of Allowance for U.S. Appl. No. 13/747,725, dated mailed Sep. 1, 2015, 9 pages.
Notice of Allowance for U.S. Appl. No. 13/747,749, dated Jun. 4, 2015, 8 pages.
Notice of Allowance for U.S. Appl. No. 13/747,749, dated Oct. 2, 2015, 8 pages.
Notice of Allowance for U.S. Appl. No. 14/072,120, dated Jul. 30, 2015, 7 pages.
Non-Final Office Action for U.S. Appl. No. 13/552,768, dated Apr. 20, 2015, 12 pages.
Notice of Allowance for U.S. Appl. No. 13/552,768, dated Sep. 22, 2015, 9 pages.
Non-Final Office Action for U.S. Appl. No. 13/689,922, dated Apr. 20, 2015, 19 pages.
Final Office Action for U.S. Appl. No. 13/689,922, dated Oct. 6, 2015, 20 pages.
Non-Final Office Action for U.S. Appl. No. 13/727,911, dated Apr. 20, 2015, 10 pages.
Notice of Allowance for U.S. Appl. No. 13/727,911, dated Sep. 14, 2015, 8 pages.
Notice of Allowance for U.S. Appl. No. 14/027,416, dated Aug. 11, 2015, 9 pages.
Non-Final Office Action for U.S. Appl. No. 14/163,229, dated Apr. 23, 2015, 9 pages.
Non-Final Office Action for U.S. Appl. No. 14/163,256, dated Apr. 23, 2015, 9 pages.
Notice of Allowance for U.S. Appl. No. 14/176,611, dated Apr. 27, 2015, 7 pages.
International Preliminary Report on Patentability for PCT/US2013/065403, dated Apr. 30, 2015, 8 pages.
Non-Final Office Action for U.S. Appl. No. 13/689,940, dated May 14, 2015, 7 pages.
Notice of Allowance for U.S. Appl. No. 13/689,940, dated Aug. 3, 2015, 6 pages.
Notice of Allowance for U.S. Appl. No. 13/689,940, dated Sep. 16, 2015, 7 pages.
Non-Final Office Action for U.S. Appl. No. 14/101,770, dated Sep. 21, 2015, 5 pages.
Notice of Allowance for U.S. Appl. No. 13/661,164, dated Jun. 3, 2015, 6 pages.
Non-Final Office Action for U.S. Appl. No. 14/082,629, dated Jun. 18, 2015, 15 pages.
Non-Final Office Action for U.S. Appl. No. 14/702,192, dated Oct. 7, 2015, 7 pages.
First Office Action for Chinese Patent Application No. 201280052694.2, dated Mar. 24, 2015, 35 pages.
First Office Action and Search Report for Chinese Patent Application No. 201280007941.7, dated May 13, 2015, 13 pages.
International Preliminary Report on Patentability for PCT/US2014/012927, dated Aug. 6, 2015, 9 pages.
First Office Action and Search Report for Chinese Patent Application No. 201210596632.X, dated Jun. 25, 2015, 16 pages.
International Preliminary Report on Patentability for PCT/US2014/028089, dated Sep. 24, 2015, 8 pages.
International Preliminary Report on Patentability for PCT/US2014/028178, dated Sep. 24, 2015, 11 pages.
Notice of Allowance for U.S. Appl. No. 13/661,164, dated Oct. 21, 2015, 7 pages.
Non-Final Office Action for U.S. Appl. No. 14/254,215, dated Oct. 15, 2015, 5 pages.
First Office Action for Chinese Patent Application No. 201180067293.X, dated Aug. 6, 2015, 13 pages.
First Office Action for Chinese Patent Application No. 201280042523.1, dated Dec. 4, 2015, 12 pages.
Notice of Allowance for U.S. Appl. No. 14/072,225, dated Feb. 3, 2016, 7 pages.
Advisory Action for U.S. Appl. No. 14/082,629, dated Jan. 22, 2016, 3 pages.
Non-Final Office Action for U.S. Appl. No. 13/876,518, dated Jan. 20, 2016, 16 pages.
Final Office Action for U.S. Appl. No. 13/661,227, dated Feb. 9, 2016, 28 pages.
Notice of Allowance for U.S. Appl. No. 14/163,256, dated Feb. 10, 2016, 8 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, dated Dec. 23, 2015, 12 pages.
Non-Final Office Action for U.S. Appl. No. 14/458,341, dated Nov. 12, 2015, 5 pages.

(56) References Cited

OTHER PUBLICATIONS

Notice of Allowance for U.S. Appl. No. 13/747,725, dated Oct. 28, 2015, 9 pages.
Advisory Action for U.S. Appl. No. 13/689,922, dated Dec. 18, 2015, 3 pages.
Notice of Allowance for U.S. Appl. 13/727,911, dated Nov. 10, 2015, 8 pages.
Notice of Allowance for U.S. Appl. No. 14/163,229, dated Nov. 5, 2015, 8 pages.
Final Office Action for U.S. Appl. No. 14/163,256, dated Nov. 2, 2015, 10 pages.
Corrected Notice of Allowability for U.S. Appl. No. 13/689,940, dated Nov. 17, 2015, 4 pages.
Final Office Action for U.S. Appl. No. 14/082,629, dated Nov. 4, 2015, 17 pages.
Communication under Rule 164(2)(a) EPC for European Patent Application No. 12725911.7, dated Feb. 17, 2016, 8 pages.
First Office Action for Chinese Patent Application No. 201280052739.6, dated Mar. 3, 2016, 31 pages.
Advisory Action for U.S. Appl. No. 13/689,883, dated Mar. 4, 2016, 3 pages.
Notice of Allowance for U.S. Appl. No. 14/458,341, dated Feb. 18, 2016, 6 pages.
Notice of Allowance for U.S. Appl. No. 13/689,922, dated Mar. 18, 2016, 9 pages.
Notice of Allowance for U.S. Appl. No. 14/101,770, dated Apr. 11, 2016, 6 pages.
Notice of Allowance for U.S. Appl. No. 14/151,167, dated Mar. 4, 2016, 7 pages.
Non-Final Office Action for U.S. Appl. No. 14/082,629, dated Mar. 16, 2016, 23 pages.
Notice of Allowance for U.S. Appl. No. 14/702,192, dated Feb. 22, 2016, 8 pages.
Notice of Allowance for U.S. Appl. No. 14/254,215, dated Feb. 18, 2016, 7 pages.
Non-Final Office Action for U.S. Appl. No. 13/689,883, dated Apr. 20, 2016, 13 pages.
Notice of Allowance and Examiner Initiated Interview Summary for U.S. Appl. No. 13/661,227, dated May 13, 2016, 10 pages.
Final Office Action for U.S. Appl. No. 13/876,518, dated Jun. 2, 2016, 14 pages.
Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.
Examination Report for European Patent Application No. 14190851.7, dated May 2, 2016, 5 pages.
Combined Search and Examination Report for European Patent Application No. 12725911.7, dated Jun. 15, 2016, 14 pages.
First Office Action for Chinese Patent Application No. 201380039592.1, dated Oct. 31, 2016, 13 pages.
Notice of Allowance and Examiner Initiated Interview Summary for U.S. Appl. No. 14/082,629, dated Dec. 7, 2016, 11 pages.
Invitation Pursuant to Rule 137(4) EPC and Article 94(3) EPC for European Patent Application No. 12725911.7, dated Jan. 2, 2017, 2 pages.
Notice of Allowance for U.S. Appl. No. 14/638,374, dated Aug. 30, 2016, 7 pages.
Notice of Allowance for U.S. Appl. 13/689,883, dated Jul. 27, 2016, 9 pages.
Final Office Action for U.S. Appl. No. 14/082,629, dated Sep. 8, 2016, 13 pages.
Advisory Action for U.S. Appl. No. 13/876,518, dated Aug. 15, 2016, 3 pages.
Notice of Allowance for U.S. Appl. No. 14/789,464, dated Oct. 26, 2016, 7 pages.
Non-Final Office Action and Examiner Initiated Interview Summary for U.S. Appl. No. 13/876,518, dated Sep. 22, 2016, 18 pages.
Notice of Allowance for U.S. Appl. No. 14/163,256, dated Feb. 21, 2017, 7 pages.
Non-Final Office Action for U.S. Appl. No. 15/142,634, dated Jan. 20, 2017, 6 pages.
Final Office Action for U.S. Appl. No. 13/876,518, dated Mar. 9, 2017, 18 pages.
Notice of Allowance for U.S. Appl. No. 12/836,307 dated May 5, 2014, 6 pages.
Notice of Allowance for U.S. Appl. No. 14/022,858 dated May 27, 2014, 6 pages.
Non-Final Office Action for U.S. Appl. No. 13/367,973 dated Apr. 25, 2014, 5 pages.
Non-Final Office Action for U.S. Appl. No. 13/647,815 dated May 2, 2014, 6 pages.
Non-Final Office Action for U.S. Appl. No. 13/689,883 dated Mar. 27, 2014, 13 pages.
Non-Final Office Action for U.S. Appl. No. 13/692,084 dated Apr. 10, 2014, 6 pages.
Non-Final Office Action for U.S. Appl. No. 13/684,826 dated Apr. 3, 2014, 5 pages.
Notice of Allowance for U.S. Appl. No. 14/022,940, dated Jun. 10, 2014, 7 pages.
Non-Final Office Action for U.S. Appl. No. 13/951,976 dated Apr. 4, 2014, 7 pages.
Invitation pursuant to Article 94(3) and Rule 71(1) EPC for European Patent Application No. 11720630.0 dated Mar. 18, 2014, 4 pages.
International Preliminary Report on Patentability for PCT/US2012/062070 dated May 8, 2014, 8 pages.
International Search Report and Written Opinion for PCT/US2012J062110 dated Apr. 8, 2014, 12 pages.
International Preliminary Report on Patentability for PCT/US2012/062110 dated May 8, 2014, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Non-Final Office Action for U.S. Appl. No. 13/486,012, dated Jul. 28, 2014, 7 pages.
Notice of Allowance for U.S. Appl. No. 13/661,552, dated Jun. 13, 2014, 5 pages.
Notice of Allowance for U.S. Appl. No. 13/692,084, dated Jul. 23, 2014, 7 pages.
International Preliminary Report on Patentability and Written Opinion for PCT/US2012/067230, dated Jun. 12, 2014, 7 pages.
Notice of Allowance for U.S. Appl. No. 13/684,826, dated Jul. 18, 2014, 7 pages.
International Search Report and Written Opinion for PCT/US2014/028089, dated Jul. 17, 2014, 10 pages.
Communication Pursuant to Article 94(3) EPC for European Patent Application No. 12725911.7, dated May 24, 2017, 6 pages.
Partial European Search Report for European Patent Application No. 16204437.4, dated Apr. 12, 2017, 9 pages.
Notice of Allowance for U.S. Appl. No. 15/195,050, dated May 18, 2017, 7 pages.
Advisory Action for U.S. Appl. No. 13/876,518, dated May 17, 2017, 3 pages.
Examination Report for European Patent Application No. 14162658.0, dated Jun. 29, 2017, 4 pages.
Extended European Search Report for European Patent Application No. 16204437.4, dated Sep. 14, 2017, 17 pages.
Non-Final Office Action for U.S. Appl. No. 15/142,725, dated Jul. 21, 2017, 7 pages.
Non-Final Office Action for U.S. Appl. No. 15/142,859, dated Aug. 11, 2017, 7 pages.
Non-Final Office Action for U.S. Appl. No. 13/876,518, dated Aug. 10, 2017, 19 pages.

* cited by examiner

DYNAMIC LOADLINE POWER AMPLIFIER WITH BASEBAND LINEARIZATION

RELATED APPLICATIONS

This application claims the benefit of provisional patent application Ser. No. 61/576,520, filed on Dec. 16, 2011, the disclosure of which is hereby incorporated herein by reference in its entirety.

FIELD OF THE DISCLOSURE

This disclosure relates generally to radio frequency (RF) amplification devices.

BACKGROUND

A Doherty amplifier includes a main radio frequency (RF) amplification circuit coupled in parallel with a peaking RF amplification circuit to provide amplification to an RF signal. At lower power levels, the main RF amplification circuit in the Doherty amplifier is turned on and biased for linear operation, while the peaking RF amplification circuit is turned off. However, the peaking RF amplification circuit turns on once the RF signal reaches a particular signal level, which is generally at or near a compression point of the main RF amplification circuit. The main RF amplification circuit is held at or near the compression point while the peaking RF amplification circuit provides additional amplification. Unfortunately, typical Doherty amplifiers rely entirely on the peaking amplifier bias level to turn on the peaking RF amplification circuit. While the main RF amplification circuit of the typical Doherty amplifier is generally provided to have a linear Class AB amplifier topology, the peaking RF amplification circuit of typical Doherty amplifiers relies on a non-linear Class C amplifier topology to remain in cutoff at signal levels below the compression point of the main RF amplification circuit. Although the input power threshold at which the peaking amplifier begins to operate can set by the Class C bias level, the rate at which the non-linear peaking amplifier turns on above the threshold level is uncontrolled. This results in non-linear behavior and a dip in the power efficiency of the typical Doherty amplifier.

Accordingly, RF circuit designs that improve the performance of the Doherty amplifier are needed.

SUMMARY

Radio frequency (RF) amplification devices and methods of amplifying RF signals are disclosed. In one embodiment, an RF amplification device includes a control circuit and a Doherty amplifier configured to amplify an RF signal. The Doherty amplifier includes a main RF amplification circuit and a peaking RF amplification circuit. The control circuit is configured to activate the peaking RF amplification circuit in response to the RF signal reaching a threshold level. In this manner, the activation of the peaking RF amplification circuit can be precisely controlled.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates one embodiment of a radio frequency (RF) amplification device that includes a Doherty amplifier that has a main RF amplification circuit and a peaking RF amplification circuit, and a control circuit configured to activate the peaking RF amplification circuit in response to a signal level of an RF signal reaching a threshold level, wherein the peaking RF amplification circuit has a driver amplifier stage and a peaking amplifier stage.

Figure 8:
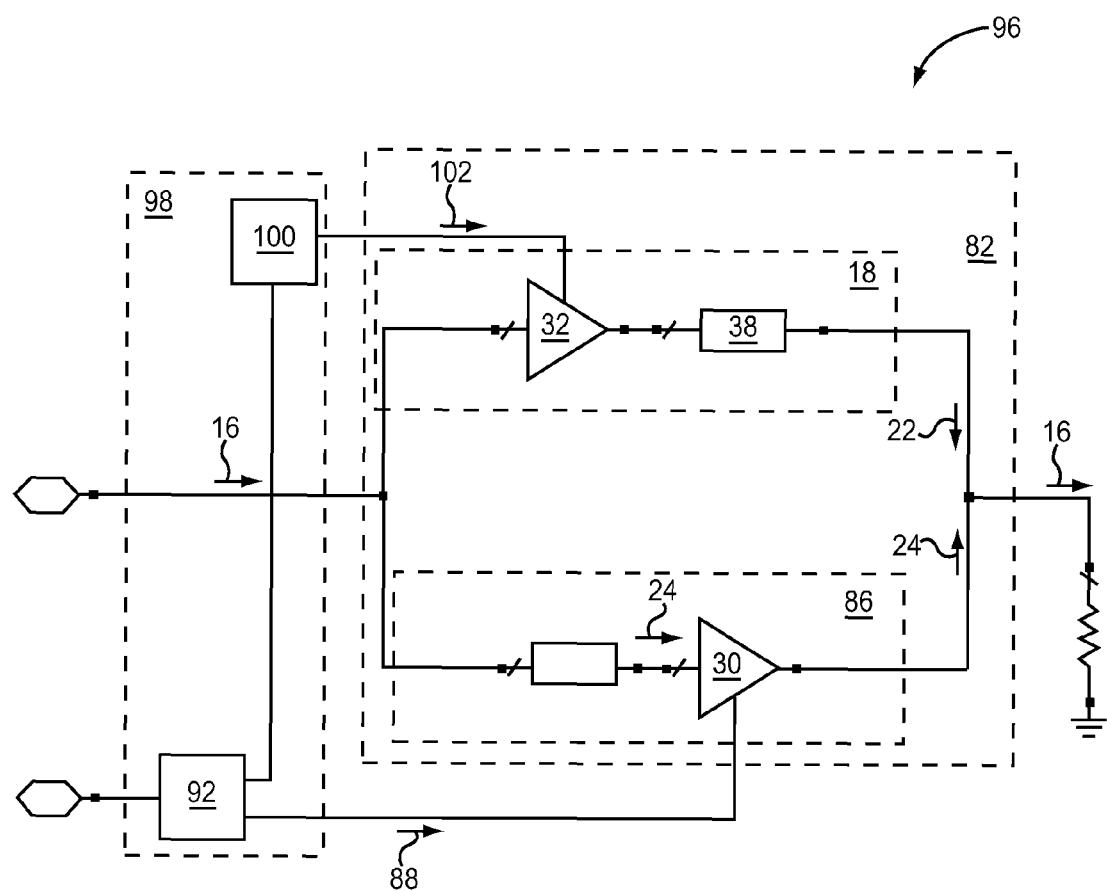

FIG. 8 illustrates another embodiment of an RF amplification device that includes a Doherty amplifier that has a main RF amplification circuit and a peaking RF amplification circuit, a control circuit that generates a gain control signal for the peaking RF amplification circuit, and a control circuit that provides envelope tracking to control a main amplifier gain of the main RF amplification circuit.

Figure 9:
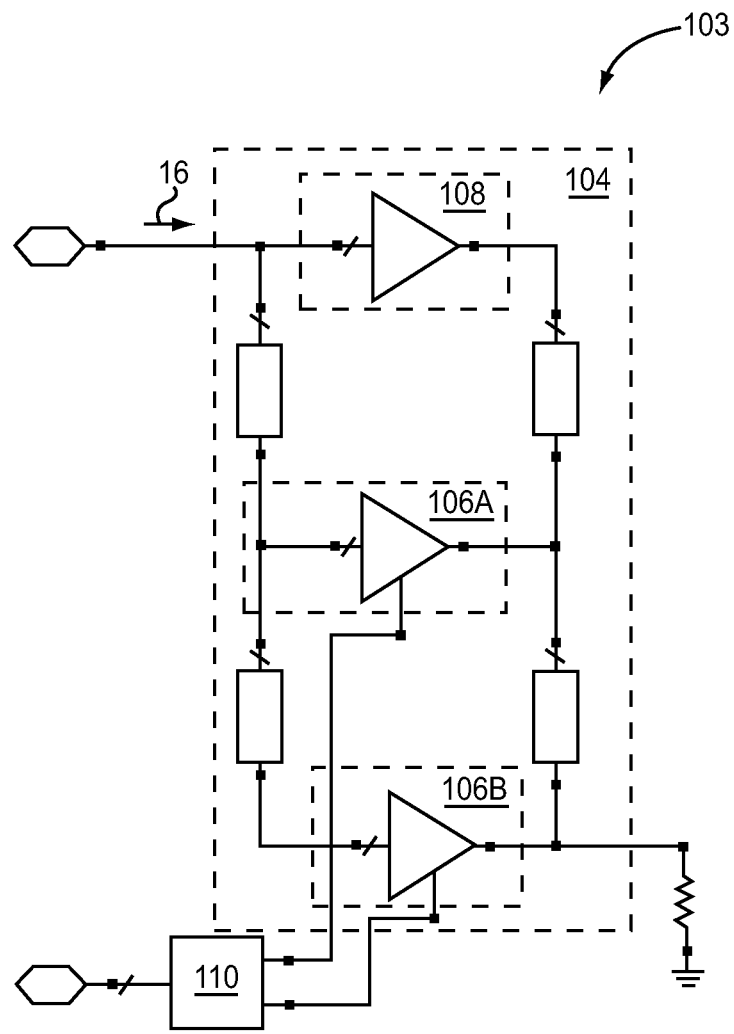

FIG. 9 illustrates another embodiment of an RF amplification device that includes an asymmetric Doherty amplifier that includes a main RF amplification circuit and multiple peaking RF amplification circuits.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
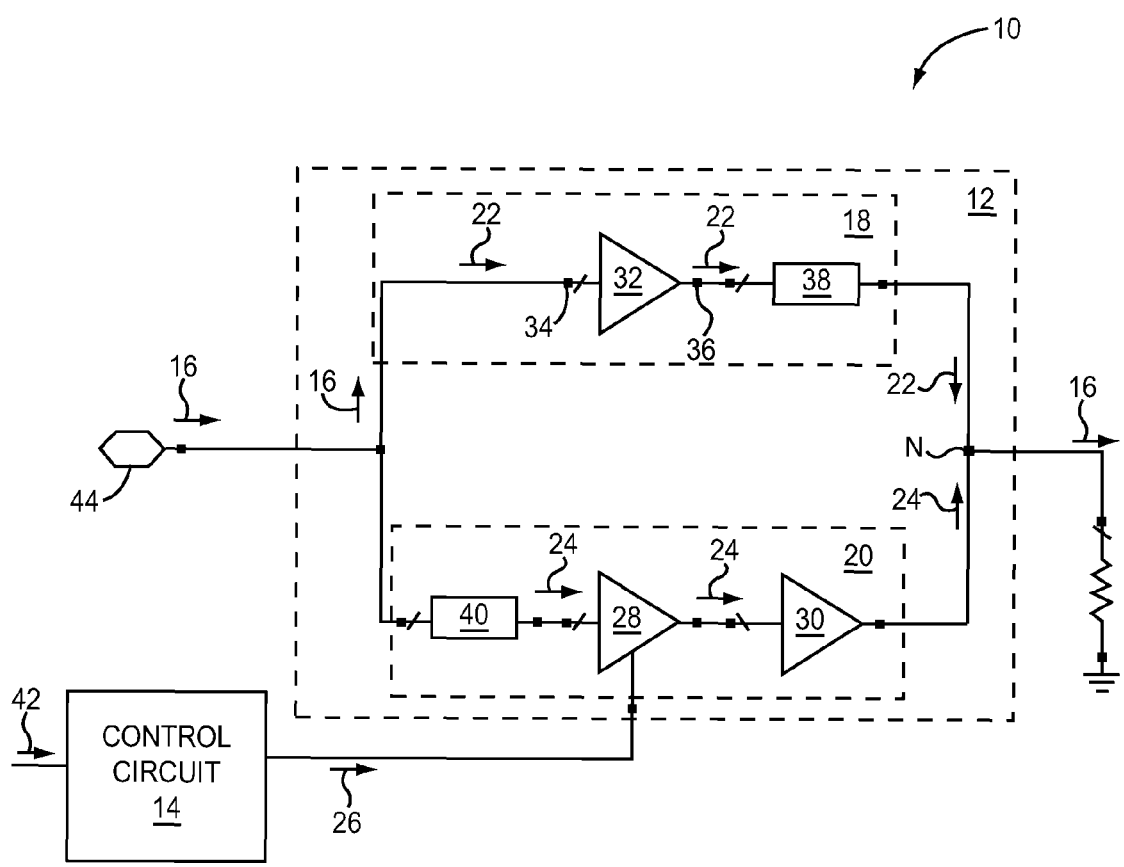

FIG. 1 illustrates one embodiment of a radio frequency (RF) amplification device 10 having a Doherty amplifier 12 and a control circuit 14. The Doherty amplifier 12 is configured to amplify an RF signal 16. To amplify the RF signal 16, the Doherty amplifier 12 includes a main RF amplification circuit 18 and a peaking RF amplification circuit 20. While a signal level of the RF signal 16 is below a threshold level, the peaking RF amplification circuit 20 is deactivated and the main RF amplification circuit 18 provides all of the amplification to the RF signal 16. The main RF amplification circuit 18 is configured to amplify the RF signal 16 in accordance with a main amplifier gain of the main RF amplification circuit 18. So long as the main RF amplification circuit 18 is within its linear operating range (i.e., below a compression point), the peaking RF amplification circuit 20 is deactivated. Thus, while the main RF amplification circuit 18 is activated and the peaking RF amplification circuit 20 is deactivated, the output impedance of the peaking RF amplification circuit 20 is very high and the peaking RF amplification circuit 20 appears like an open circuit at node N.

However, in response to the signal level of the RF signal 16 reaching the threshold level, the control circuit 14 is configured to activate the peaking RF amplification circuit 20. The main RF amplification circuit 18 remains activated, but is held at or near its peak power level. Generally, this peak power level is just before the compression point of the main RF amplification circuit 18. In this manner, the control circuit 14 can be used to precisely regulate the activation of the peaking RF amplification circuit 20.

While the main RF amplification circuit 18 is activated and the peaking RF amplification circuit 20 is activated (generally at or near the compression point of the main RF amplification circuit 18), the RF signal 16 is split into a first RF split signal 22 and a second RF split signal 24. The main RF amplification circuit 18 is configured to amplify the first RF split signal 22. The peaking RF amplification circuit 20 is configured to amplify the second RF split signal 24. In addition, the first RF split signal 22 and the second RF split signal 24 are quadrature-phased with respect to one another. Accordingly, the phase of the first RF split signal 22 and the phase of the second RF split signal 24 have a phase difference of approximately 90° or $\pi/2$ radians. To increase amplification by the Doherty amplifier 12, a signal level of the second RF split signal 24 is gradually increased. As such, as the signal level of the RF signal 16 rises, and the signal level of the second RF split signal 24 also rises. Accordingly, the gain of the peaking RF amplification circuit 20 is increased gradually so that a greater portion of the RF signal 16 is provided by the peaking RF amplifier at the output node N as the signal level of the RF signal 16 continues to rise. After the signal level of the RF signal 16 reaches its peak and the signal level drops, the peaking RF amplification circuit 20 is deactivated, and the main RF amplification circuit 18 again provides all the amplification for the RF signal 16 when the signal level of the RF signal 16 is again below the threshold level.

Unlike a typical Doherty amplifier, where a fixed Class C bias point is used to determine the turn-on point of the peaking RF amplification circuit 20 in this embodiment, the control circuit 14 is configured to activate the peaking RF amplification circuit 20 in response to the signal level of the RF signal 16 reaching the threshold level. Accordingly, the turn-on point for the peaking RF amplification circuit 20 is not determined (or at least is not entirely determined) by a bias point, but rather is determined by the control circuit 14 when the signal level of the RF signal 16 reaches the threshold level. Thus, the control circuit 14 can control when the peaking RF amplification circuit 20 turns on and the rate at which it turns on with greater precision. As such, the peaking RF amplification circuit 20 shown in FIG. 1 does not depend on a Class C amplifier topology to remain in cutoff while the signal level of the RF signal 16 is below the threshold level. Accordingly, the peaking RF amplification circuit 20 may be configured to have a Class AB amplifier topology, which is more linear.

As illustrated in FIG. 1, the control circuit 14 is configured to generate a control signal 26 having a control signal level, and the peaking RF amplification circuit 20 is operable to receive the control signal 26 from the control circuit 14. In this embodiment, the peaking RF amplification circuit 20 is configured to be activated in response to the control signal level of the control signal 26 being above an activation level. Accordingly, when the peaking RF amplification circuit 20 receives the control signal 26 having the control signal level above the activation level, the peaking RF amplification circuit 20 is activated. To activate the peaking RF amplification circuit 20, the control circuit 14 is configured to provide the control signal level above the activation level in response to the signal level of the RF signal 16 reaching the threshold level. In fact, the peaking RF amplification circuit 20 may be a duplicate of the main RF amplification circuit 18 where both the main RF amplification circuit 18 and the peaking RF amplification circuit 20 have an AB amplifier topology.

In this embodiment, the peaking RF amplification circuit 20 includes a driver amplifier stage 28 and a peaking amplifier stage 30. The driver amplifier stage 28 is operable to receive the second RF split signal 24 and the control signal 26, which in this embodiment is a gain control signal 26 where the control signal level is a gain control signal level. The driver amplifier stage 28 is configured to amplify the second RF split signal 24 in accordance with a driver amplifier stage gain of the driver amplifier stage 28. The peaking amplifier stage 30 is coupled in cascade with the driver amplifier stage 28, and thus, is operable to receive the second RF split signal 24 from the driver amplifier stage 28. The driver amplifier stage gain is being used to control a peaking amplifier overall gain of the peaking RF amplification circuit 20.

The peaking amplifier stage 30 is configured to amplify the second RF split signal 24 in accordance with the peaking amplifier stage gain. Thus, since the peaking amplifier stage 30 is coupled in cascade with the driver amplifier stage 28, the peaking amplifier gain is a combination of the driver amplifier stage gain and the peaking amplifier stage gain. More specifically, the peaking amplifier gain in this embodiment is approximately equal to the driver amplifier stage gain magnified (or multiplied) by the peaking amplifier stage gain. The driver amplifier stage 28 is configured to set the driver amplifier stage gain in accordance with the gain control signal level of the gain control signal 26. The peaking RF amplification circuit 20 is thus configured to provide amplification in accordance with the peaking amplifier gain, which is set based on the gain control signal level of the gain control signal 26 (since, in this embodiment, the gain control signal level sets the driver amplifier stage gain). Thus, by varying the driver amplifier stage gain of the driver amplifier stage 28, the overall peaking amplifier gain of the peaking RF amplification circuit 20 is varied.

While the main RF amplification circuit 18 and the peaking RF amplification circuit 20 are both activated, the main RF amplification circuit 18 is configured to provide amplification in accordance with a main amplifier gain, and the peaking RF amplification circuit 20 is configured to provide amplification in accordance with the peaking amplifier gain. The combination of the main amplifier gain and the peaking amplifier gain determines a Doherty amplifier gain, which is the overall gain of the Doherty amplifier 12. Preferably, the Doherty amplifier 12 operates linearly. To do this, the control circuit 14 is configured to provide the gain control signal level of the gain control signal 26 such that the peaking amplifier gain of the peaking RF amplification circuit 20 in combination with the main amplifier gain linearizes the Doherty amplifier gain. In other words, the peaking amplifier gain is set such that the Doherty amplifier gain is maintained substantially constant.

While the main RF amplification circuit 18 is activated and the peaking RF amplification circuit 20 is deactivated, the main RF amplification circuit 18 is configured to amplify the RF signal 16 in accordance with the main amplifier gain, while the peaking RF amplification circuit 20 does not provide amplification. To deactivate the peaking RF amplification circuit 20, the control circuit 14 is configured to provide the gain control signal 26 so that the gain control signal level that is below the activation level. As such, the driver amplifier stage 28 is turned off and the peaking RF amplification circuit 20 is deactivated because the peaking RF amplification circuit 20 appears as an open circuit. Accordingly, the RF signal 16 is (for the most part) transferred to the main RF amplification circuit 18 for amplification.

As shown in FIG. 1, the main RF amplification circuit 18 includes a main amplifier stage 32 having an input terminus 34 and an output terminus 36. The main amplifier stage 32 is operable to receive the RF signal 16 at the input terminus 34 and output the RF signal 16 after amplification from the output terminus 36. The main amplifier stage 32 has a main amplifier gain so that signals that are input in the input terminus 34 are amplified in accordance with the main amplifier gain and output at the output terminus 36 after amplification. The main RF amplification circuit 18 also includes a phase-shifting transmission line element 38. The phase-shifting transmission line element 38 is coupled to the output terminus 36 and is configured to provide a quadrature phase shift to the RF signal 16. As such, the phase-shifting transmission line element 38 provides a quarter-wavelength delay. While the peaking RF amplification circuit 20 is deactivated, the effect of the phase-shifting transmission line element 38 is simply to provide a delay, and assuming that parasitic resistances are maintained at relatively low levels, the phase-shifting transmission line element 38 has little effect on the RF signal 16.

As mentioned above, while the main RF amplification circuit 18 and the peaking RF amplification circuit 20 are both activated, the RF signal 16 is split into the first RF split signal 22 and the second RF split signal 24. As illustrated in FIG. 1, the peaking RF amplification circuit 20 includes a phase-shifting transmission line element 40 configured to provide a quadrature phase shift. The quadrature phase shift splits the RF signal 16 into the first RF split signal 22 and the second RF split signal 24, which are quadrature phased with respect to one another. After amplification by the main amplifier stage 32 and the peaking amplifier stage 30, the first RF split signal 22 and the second RF split signal 24 should be phase-aligned, otherwise the signals will destructively interfere. Accordingly, the phase-shifting transmission line element 38 in the main RF amplification circuit 18 provides another quadrature phase shift so that the first RF split signal 22 and the second RF split signal 24 are phase-aligned. More specifically, the main RF amplification circuit 18 and the peaking RF amplification circuit 20 are operably associated so that the first RF split signal 22 and the second RF split signal 24 are phase-aligned and combined at node N to output the RF signal 16 from the Doherty amplifier 12 after amplification.

Referring again to FIG. 1, the control circuit 14 is configured to receive an instantaneous power indication signal 42 having an instantaneous power indication signal level indicative of the signal level of the RF signal 16 at an input terminal 44. The signal level of the RF signal 16 at the input terminal 44 reaches the threshold level when the instantaneous power indication signal level reaches a power threshold level. The control circuit 14 provides the gain control signal level above the activation level so as to activate the peaking RF amplification circuit 20 in response to the instantaneous power indication signal level of the instantaneous power indication signal 42 reaching the power threshold level.

The control circuit 14 is configured to provide the gain control signal level of the gain control signal 26 as a function of the instantaneous power indication signal level. The control circuit 14 detects the signal level of the RF signal 16 from the instantaneous power indication signal level of the instantaneous power indication signal 42. The control circuit 14 may be analog, and may have an analog transfer response that generates the gain control signal 26 having the gain control signal level as a function of the instantaneous power indication signal level. Alternatively, the control circuit 14 may be digital, and may be programmed to look up a gain control data field from a table that defines a transfer response based on the instantaneous power indication signal level. Digital-to-analog converters may then be used to generate the gain control signal 26 so that the gain control signal level corresponds with the gain control data field from the table. The gain control signal 26 may be a baseband signal that provides precise control of both the level at which the peaking RF amplification circuit 20 begins to turn on and the shape of the Doherty amplifier gain versus an instantaneous power level transfer function. An appropriately configured baseband signal, such as the gain control signal 26, can control the output of the peaking RF amplification circuit 20 to optimize the impedance seen by the main RF amplification circuit 18 and eliminate AM/AM distortion at the node N.

The shape of the gain control signal 26 can be fixed, or may be more appropriately defined with a one-time or periodic calibration. Multiple baseband shapes may also be used for optimum performance over a range of operating conditions, such as frequency, temperature, supply voltage, or load. In the calibration process, the magnitude of the gain control signal 26 may be defined to achieve a desired Doherty amplifier gain characteristic, such as iso-gain. Additionally, the shape of the gain control signal 26 versus instantaneous power indication signal level (i.e., the transfer function of the control circuit 14) can be defined as a polynomial. Note that in an alternative embodiment, the driver amplifier stage 28 may be replaced with a voltage variable attenuator.

Figure 2:
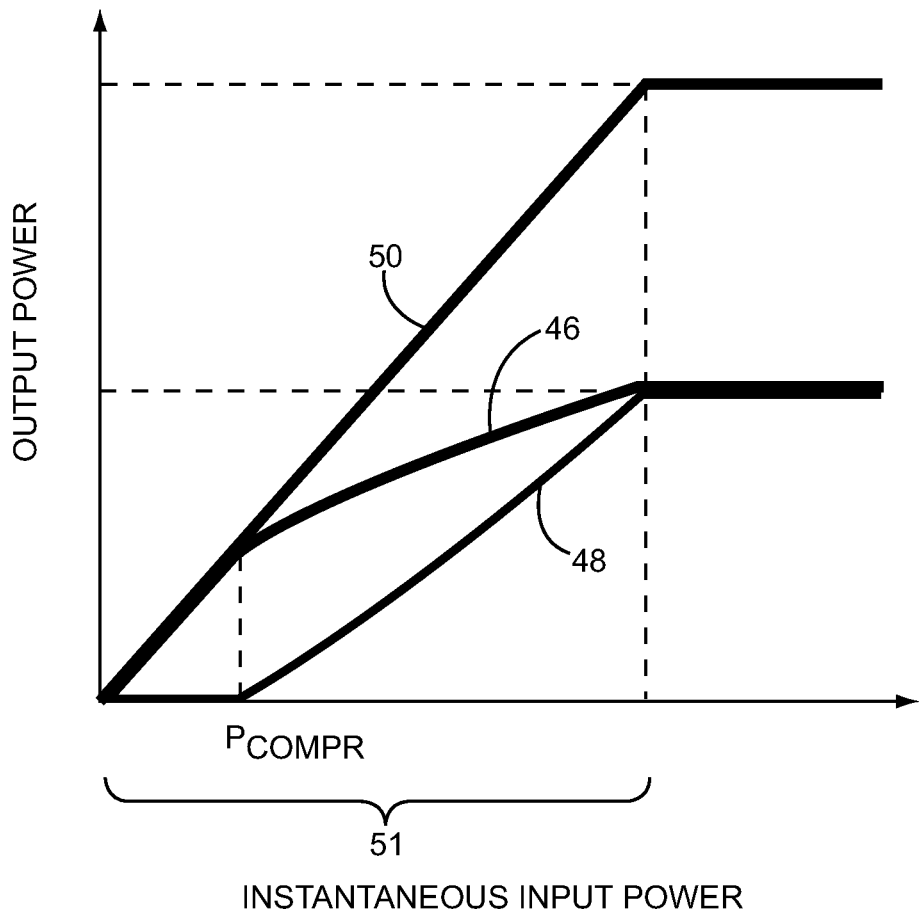
FIG. 2 illustrates exemplary instantaneous input power versus output power curves of the main RF amplification circuit, the peaking RF amplification circuit, and the Doherty amplifier illustrated in FIG. 1.

Referring now to FIGS. 1 and 2, FIG. 2 illustrates embodiments of instantaneous input power versus output power (IIPVOP) curves 46, 48, 50. The IIPVOP curve 46 plots the IIPVOP of the main RF amplification circuit 18. The IIPVOP curve 48 plots the IIPVOP of the peaking RF amplification circuit 20. The IIPVOP curve 50 plots the IIPVOP of the Doherty amplifier 12.

As shown in FIG. 2, the peaking RF amplification circuit 20 is deactivated while the instantaneous power of the RF signal 16 is below a power level $P_{COMPR}$. At the power level $P_{COMPR}$, the main RF amplification circuit 18 reaches the compression point and the control circuit 14 provides the gain control signal level of the gain control signal 26 so as to activate the peaking RF amplification circuit 20. Once the peaking RF amplification circuit 20 is activated at the power level $P_{COMPR}$, the IIPVOP curve 48 of the peaking RF amplification circuit 20 shows that output power from the peaking RF amplification circuit 20 is set so as to linearize the IIPVOP curve 50 of the Doherty amplifier 12. Thus, the Doherty amplifier gain is maintained constant over a linear operating range 51 of the Doherty amplifier 12.

Figure 3:
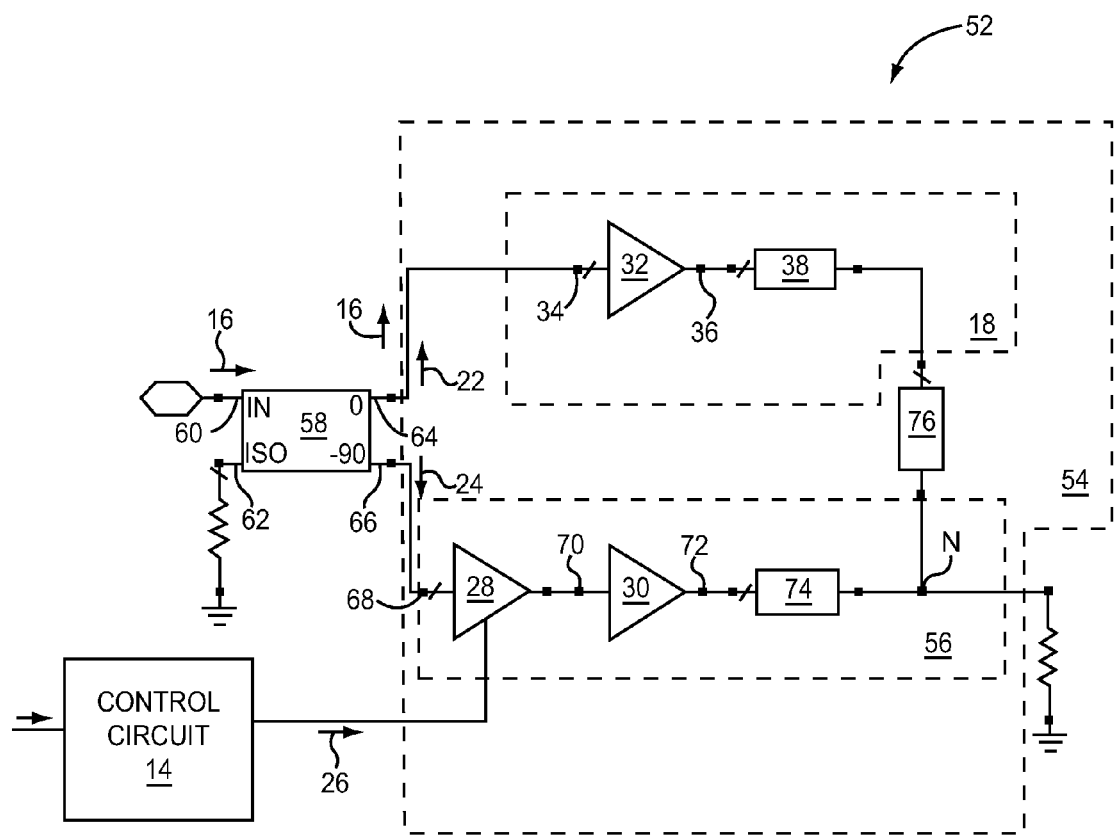
FIG. 3 illustrates another embodiment of an RF amplification device that includes a control circuit and a Doherty amplifier that has a main RF amplification circuit and a peaking RF amplification circuit, wherein the main RF amplification circuit and the peaking RF amplification circuit are operably associated by a hybrid coupler.

FIG. 3 illustrates another embodiment of an RF amplification device 52. The RF amplification device 52 includes the control circuit 14 described above and a Doherty amplifier 54. The Doherty amplifier 54 also includes the main RF amplification circuit 18 described above and a peaking RF amplification circuit 56 that includes the driver amplifier stage 28 and the peaking amplifier stage 30 described above. However, in this embodiment, the main RF amplification circuit 18 and the peaking RF amplification circuit 56 are operably associated by a hybrid coupler 58. The hybrid coupler 58 includes a first port 60, a second port 62, a third port 64, and a fourth port 66. The first port 60 is operable to receive the RF signal 16. The second port 62 is an isolated port. The third port 64 is coupled to the main RF amplification circuit 18. The fourth port 66 is coupled to the peaking RF amplification circuit 56.

When the peaking RF amplification circuit 56 is deactivated, the input terminus 34 is coupled to the third port 64 to receive the RF signal 16, which is amplified exclusively by the main RF amplification circuit 18 while the peaking RF amplification circuit 56 is deactivated. No phase shift is provided by the hybrid coupler 58 from the first port 60 to the third port 64.

However, while the main RF amplification circuit 18 is activated and the peaking RF amplification circuit 56 is activated, the hybrid coupler 58 is configured to split the RF signal 16 into the first RF split signal 22 and the second RF split signal 24. The hybrid coupler 58 provides a quadrature phase shift from the first port 60 to the fourth port 66, and thus, the second RF split signal 24 is received by the driver amplifier stage 28 at an input terminus 68 with a quadrature phase shift. The peaking amplifier stage 30 has an input terminus 70 and an output terminus 72, and is configured to provide amplification in accordance with the peaking amplifier stage gain. A phase-shifting transmission line element 74 is coupled to the output terminus 72 and is configured to provide a quadrature phase shift. The phase-shifting transmission line element 74 is identical to the phase-shifting transmission line element 38. The peaking amplifier stage 30 is also identical to the main amplifier stage 32. The gain control signal level of the gain control signal 26 controls the peaking amplifier gain of the peaking RF amplification circuit 56. In this embodiment, a phase-shifting transmission line element 76 is coupled between the main RF amplification circuit 18 and the peaking RF amplification circuit 56. The phase-shifting transmission line element 76 is configured to provide a phase shift that aligns the phases of the outputs at the node N. More specifically, the phase shift of the phase-shifting transmission line element 76 rotates a phase angle of a source impedance at the node N to match a load impedance at the node N and optimize power efficiency.

Figure 4:
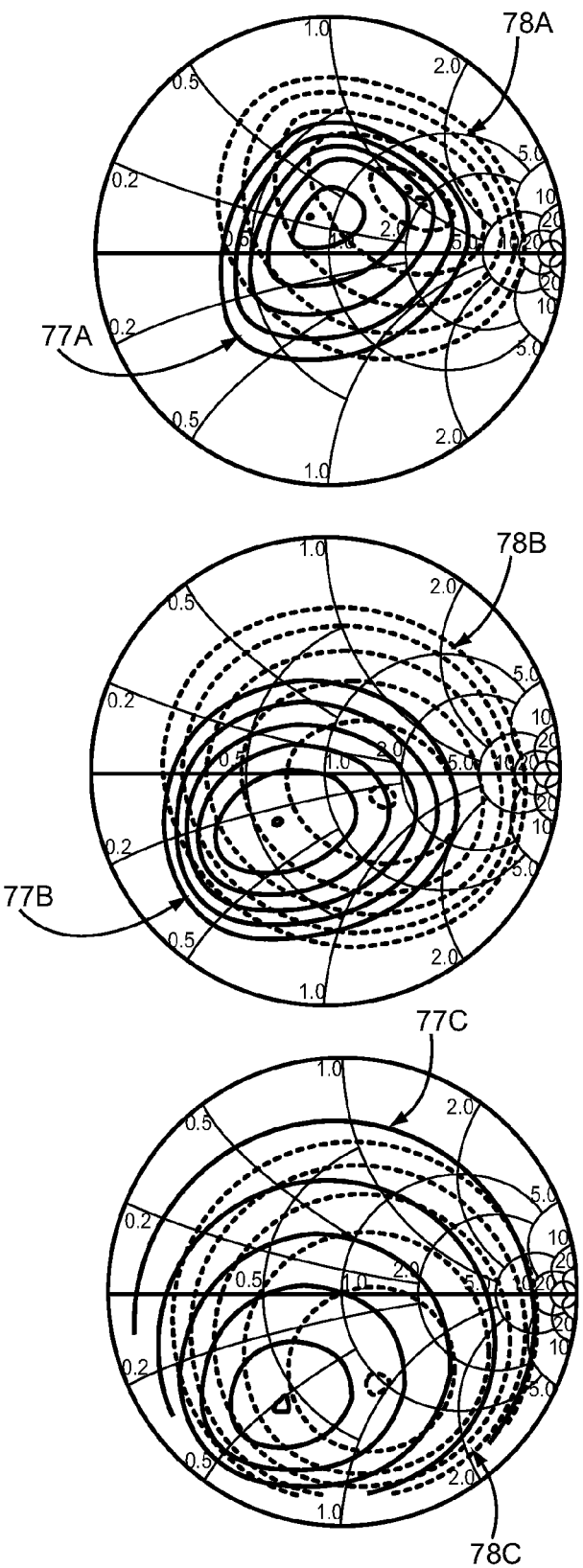
FIG. 4 illustrates Smith charts with load pull contours for a main RF amplifier stage within the main RF amplification circuit of both FIGS. 1 and 3 at various instantaneous power input levels.

FIG. 4 illustrates Smith charts with load pull contours of the main peaking amplifier stage 32, which has a class AB amplifier topology, at various instantaneous power levels. The first load contours (referred to generically as element 77, and specifically as elements 77A-77C) are maximum power-added efficiency contours. The second load contours (referred to generically as element 78, and specifically as elements 78A-78C) are maximum power delivered contours. From the first load contours 77 and the second load contours 78, it can be seen that the load impedance for maximum power-added efficiency is a function of instantaneous input power.

Figure 5:
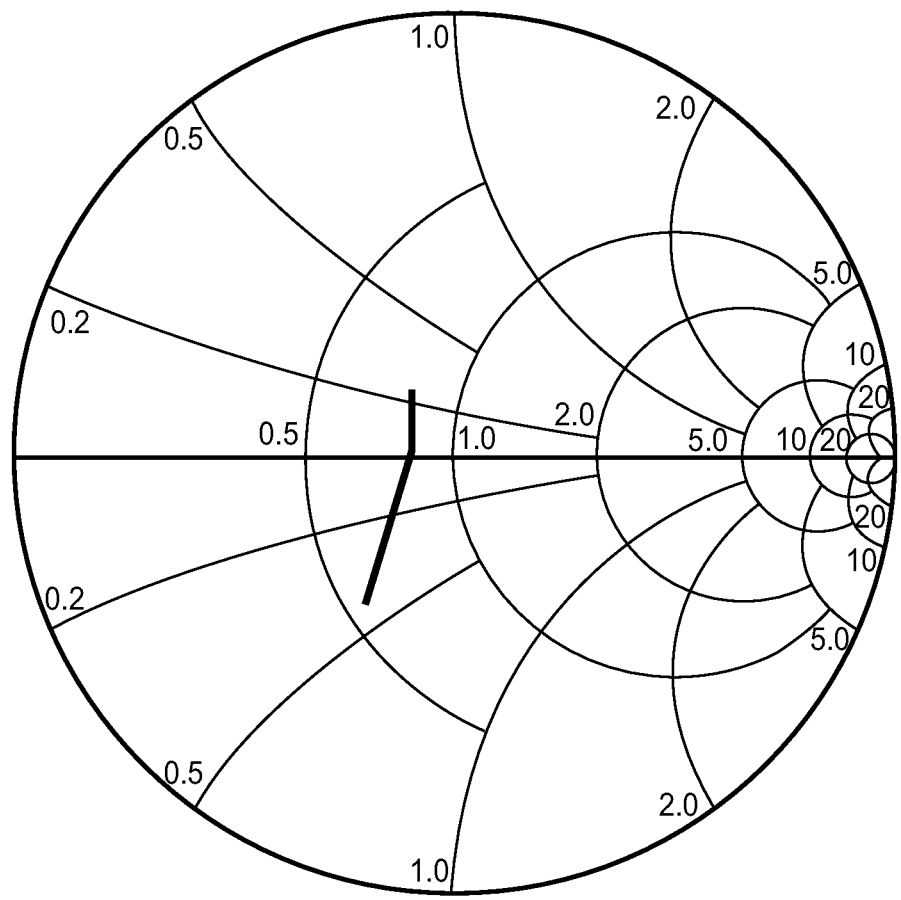
FIG. 5 illustrates a locus of the load impedance required for maximum power-added efficiency plotted as a function of instantaneous input power as indicated by the load pull contours of the Smith charts illustrated in FIG. 4.

FIG. 5 illustrates a locus of the load impedance required for maximum power-added efficiency as a function of instantaneous input power. With regard to the embodiment of the RF amplification device 52 shown in FIG. 3, a length of the phase-shifting transmission line element 76 is used to provide a rotation of the phase angle to match the load impedance at maximum power to the center of the Smith chart shown in FIG. 5.

Figure 6:
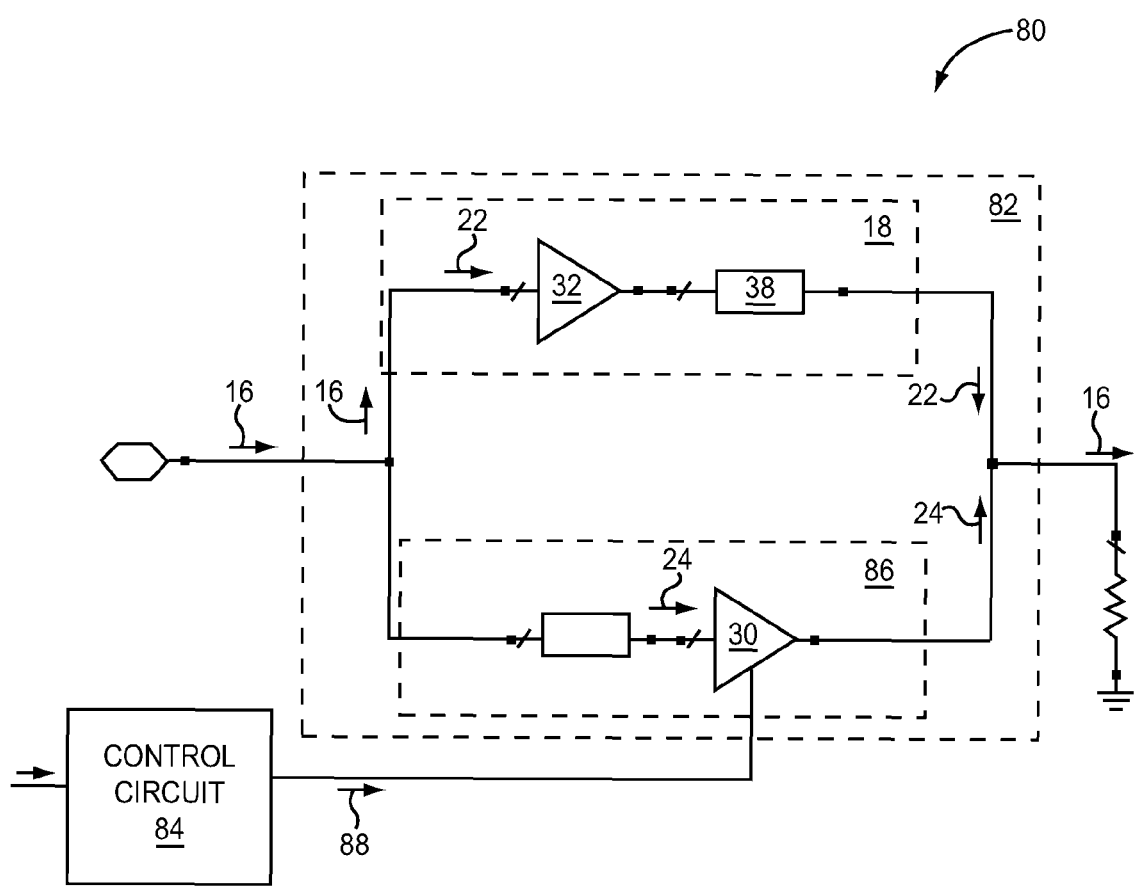
FIG. 6 illustrates another embodiment of an RF amplification device that includes a control circuit and a Doherty amplifier that has a main RF amplification circuit and a peaking RF amplification circuit, wherein, unlike the peaking RF amplification circuit of FIG. 1, the peaking RF amplification circuit of FIG. 6 does not include a driver amplifier stage.

Next, FIG. 6 illustrates another embodiment of an RF amplification device 80. The RF amplification device 80 includes a Doherty amplifier 82 and a control circuit 84. The Doherty amplifier 82 is similar to the Doherty amplifier 12 shown in FIG. 1, except that a peaking RF amplification circuit 86 in the Doherty amplifier 82 does not include the driver amplifier stage 28 shown in FIG. 1. Instead, the peaking amplifier stage 30 is configured to receive a gain control signal 88 from the control circuit 84 to control the peaking amplifier stage gain of the peaking amplifier stage 30. More specifically, the gain control signal 88 may be applied as a supply voltage or a bias signal so that the peaking amplifier stage gain is adjusted by varying the gain control signal level of the gain control signal 88. The control circuit 84 is configured to activate the peaking RF amplification circuit 86 in response to the signal level of the RF signal 16 reaching a threshold level by providing the gain control signal level above an activation level for the peaking amplifier stage 30.

Figure 7:
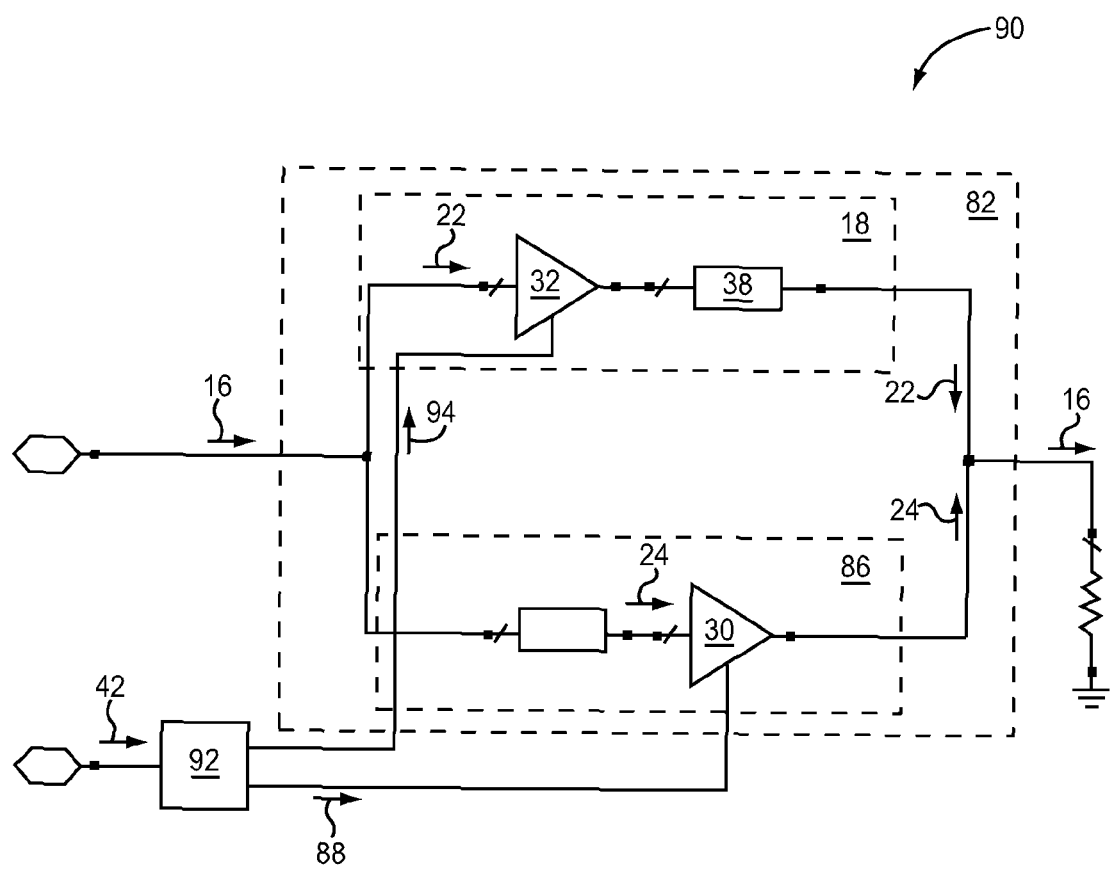
FIG. 7 illustrates another embodiment of an RF amplification device that includes a Doherty amplifier that has a main RF amplification circuit and a peaking RF amplification circuit, and a control circuit that generates a gain control signal for both the main RF amplification circuit and the peaking RF amplification circuit.

FIG. 7 illustrates another embodiment of an RF amplification device 90. The RF amplification device 90 includes the Doherty amplifier 82 described above with respect to FIG. 6. The RF amplification device 90 also includes a control circuit 92. The control circuit 92 is configured to generate the gain control signal 88 in the same manner described above with respect to FIG. 6. As such, the control circuit 92 is configured to activate the peaking RF amplification circuit 86 in response to the signal level of the RF signal 16 reaching the threshold level. As described with regard to the control circuit 14 in FIG. 1, the control circuit 92 does this by detecting the signal level of the RF signal 16 through the instantaneous power indication signal 42. The control circuit 92 provides the gain control signal level above the activation level in response to the instantaneous power indication signal level reaching a power threshold level. The peaking RF amplification circuit 86 is also configured to provide amplification in accordance with a peaking amplifier gain, which is set based on the gain control signal level of the gain control signal 88. In particular, the gain control signal 88 may be a supply voltage or a bias signal. As such, varying the gain control signal level of the gain control signal 88 also varies the peaking amplifier stage gain of the peaking amplifier stage 30 and thereby the peaking amplifier gain of the peaking RF amplification circuit 86.

Furthermore, the control circuit 92 also generates a gain control signal 94 having a gain control signal level. The main RF amplification circuit 18 is operable to receive the gain control signal 94. The main RF amplification circuit 18 is configured to provide amplification in accordance with the main amplifier gain, and to set the main amplifier gain in accordance with the gain control signal level of the gain control signal 94. While the main RF amplification circuit 18 is activated and the peaking RF amplification circuit 86 is deactivated, the main RF amplification circuit 18 is configured to amplify the RF signal 16 in accordance with the main amplifier gain. Prior to the RF signal 16 having the signal level at the threshold level, only the main RF amplification circuit 18, and not the peaking RF amplification circuit 86, amplifies the RF signal 16. The gain control signal level of the gain control signal 94 is adjusted so that the main amplifier gain is maintained relatively constant, allowing the main RF amplification circuit 18 to operate linearly. Since a Doherty amplifier gain of the Doherty amplifier 82 is set entirely by the main RF amplification circuit 18 prior to the signal level of the RF signal 16 reaching the threshold level, the Doherty amplifier gain is linearized by the gain control signal level of the gain control signal 94.

However, while both the main RF amplification circuit 18 and the peaking RF amplification circuit 86 are activated, the RF signal 16 is split into the first RF split signal 22 and the second RF split signal 24. When the signal level of the RF signal 16 is above the threshold level, the gain control signal 88 is provided to the peaking RF amplification circuit 86 and the gain control signal 94 is provided to the main RF amplification circuit 18 so as to substantially linearize the Doherty amplifier gain while simultaneously achieving maximum efficiency. In other words, the control circuit 92 is configured to provide the gain control signal level of the gain control signal 88 and the gain control signal level of the gain control signal 94 such that the Doherty amplifier gain is substantially linearized while the main RF amplification circuit 18 and the peaking RF amplification circuit 86 are activated.

FIG. 8 illustrates another embodiment of an RF amplification device 96. The RF amplification device 96 is the same as the RF amplification device 90 described above with regard to FIG. 7, except for a control circuit 98. The control circuit 98 includes the control circuit 92 described above with regard to FIG. 7, but also includes a control circuit 100. The control circuit 100 is an envelope tracking circuit that provides a gain control signal 102 to control the main amplifier gain of the main RF amplification circuit 18. So long as an input envelope of the RF signal 16 is below a preset threshold, the gain control signal level of the gain control signal 102 is used for envelope tracking. The envelope tracking circuit (i.e., the control circuit 100) may provide a variable collector or drain voltage to the main amplifier stage 32. When an amplitude of the input envelope is above a threshold level, the main RF amplification circuit 18 may fix the gain control signal level at its peak so that the gain control signal 88 linearizes the Doherty amplifier gain.

FIG. 9 illustrates another embodiment of an RF amplification device 103. The RF amplification device 103 includes an asymmetric Doherty amplifier 104. As such, the asymmetric Doherty amplifier 104 includes multiple peaking RF amplification circuits 106A and 106B, which are configured to be activated at different threshold levels of the RF signal 16. Accordingly, a main RF amplification circuit 108 is activated and the peaking RF amplification circuits 106A and 106B are deactivated so long as the signal level of the RF signal 16 is below a first threshold level and a second threshold level.

Once the signal level of the RF signal 16 reaches the first threshold level, the peaking RF amplification circuit 106A is activated by a control circuit 110. The RF signal 16 is split into a first RF split signal (not shown) amplified by the main RF amplification circuit 108 and a second RF split signal (not shown) amplified by the peaking RF amplification circuit 106A. However, since the first threshold level is lower than the second threshold level, the peaking RF amplification circuit 106B remains deactivated. Once the signal level of the RF signal 16 reaches the second threshold level, the peaking RF amplification circuit 106B is activated by the control circuit 110. The RF signal 16 is split into the first RF split signal amplified by the main RF amplification circuit 108, the second RF split signal amplified by the peaking RF amplification circuit 106A, and a third RF split signal (not shown) amplified by the peaking RF amplification circuit 106B.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) amplification device comprising:
   a Doherty amplifier configured to amplify an RF signal, wherein the Doherty amplifier comprises a main RF amplification circuit and a peaking RF amplification circuit; and
   a control circuit configured to:
      receive an instantaneous power indication signal having an instantaneous power indication signal level indicative of a signal level of the RF signal;
      generate a gain control signal having a gain control signal level, wherein the gain control signal level above an activation level is in response to the instantaneous power indication signal level of the instantaneous power indication signal reaching a power threshold level; and
      provide the gain control signal to the peaking RF amplification circuit, wherein:
         the peaking RF amplification circuit is configured to be activated in response to the gain control signal level being above the activation level; and
         the peaking RF amplification circuit is configured to provide amplification in accordance with a peaking amplifier gain that is set based on the gain control signal level of the gain control signal.

2. The RF amplification device of claim 1:
   wherein the main RF amplification circuit and the peaking RF amplification circuit are operably associated such that:
      while the main RF amplification circuit is activated and the peaking RF amplification circuit is deactivated, the main RF amplification circuit is configured to amplify the RF signal in accordance with a main amplifier gain; and
      while the main RF amplification circuit is activated and the peaking RF amplification circuit is activated, the RF signal is split into a first RF split signal and a second RF split signal that are quadrature phased with respect to one another, so that the main RF amplification circuit is configured to amplify the first RF split signal and the peaking RF amplification circuit is configured to amplify the second RF split signal.

3. The RF amplification device of claim 2 wherein the peaking RF amplification circuit comprises:
   a driver amplifier stage operable to receive the second RF split signal and the gain control signal, the driver amplifier stage being configured to amplify the second RF split signal in accordance with a driver amplifier stage gain and to set the driver amplifier stage gain in accordance with the gain control signal level of the gain control signal; and a peaking amplifier stage coupled in cascade with the driver amplifier stage, the peaking amplifier stage being operable to receive the second RF split signal from the driver amplifier stage and being configured to amplify the second RF split signal in accordance with a peaking amplifier stage gain, wherein the peaking amplifier gain is a combination of the driver amplifier stage gain and the peaking amplifier stage gain.

4. The RF amplification device of claim 3 wherein the peaking amplifier gain is approximately equal to the driver amplifier stage gain magnified by the peaking amplifier stage gain.

5. The RF amplification device of claim 2 wherein the peaking RF amplification circuit comprises a peaking amplifier stage operable to receive the second RF split signal and being configured to amplify the second RF split signal in accordance with a peaking amplifier stage gain, wherein the peaking amplifier stage gain is set in accordance with the gain control signal level.

6. The RF amplification device of claim 2 wherein the control circuit is further configured to provide a second gain control signal having a second gain control signal level to the main RF amplification circuit, such that the main RF amplification circuit is configured to provide amplification in accordance with the main amplifier gain that is set based on the second gain control signal level.

7. The RF amplification device of claim 6 wherein the Doherty amplifier is configured to provide amplification in accordance to a Doherty amplifier gain and wherein the control circuit is configured to provide the gain control signal level and the second gain control signal level such that the Doherty amplifier gain is substantially linearized while the main RF amplification circuit is activated and the peaking RF amplification circuit is activated.

8. The RF amplification device of claim 2 wherein the main RF amplification circuit and the peaking RF amplification circuit are further operably associated such that the first RF split signal and the second RF split signal are phase-aligned and combined to output the RF signal from the Doherty amplifier after amplification.

9. The RF amplification device of claim 2 further comprising a hybrid coupler wherein:

the main RF amplification circuit comprises a main amplifier stage and a first phase-shifting transmission line element, wherein:

the main amplifier stage has a first input terminus and a first output terminus and is configured to provide amplification in accordance with the main amplifier gain; and the first phase-shifting transmission line element is coupled to the first output terminus and is configured to provide a quadrature phase shift;

the peaking RF amplification circuit comprises a peaking amplifier stage and a second phase-shifting transmission line element, wherein:

the peaking amplifier stage has a second input terminus and a second output terminus and is configured to provide amplification in accordance with a peaking amplifier stage gain; and the second phase-shifting transmission line element is coupled to the second output terminus and is configured to provide a quadrature phase shift; and the hybrid coupler is operable to receive the RF signal and is coupled to the first input terminus and the second input terminus, wherein the hybrid coupler is configured to transmit the RF signal to the main amplifier stage while the main RF amplification circuit is activated and the peaking RF amplification circuit is deactivated, and the hybrid coupler is configured to split the RF signal into the first RF split signal and the second RF split signal to transmit the first RF split signal to the first input terminus and to transmit the second RF split signal to the second input terminus while the main RF amplification circuit is activated and the peaking RF amplification circuit is activated.

10. The RF amplification device of claim 2 wherein the peaking RF amplification circuit comprises a peaking amplifier stage and a phase-shifting transmission line element and wherein:

the peaking amplifier stage has an input terminus and is configured to provide amplification in accordance with a peaking amplifier stage gain; and the phase-shifting transmission line element is coupled to the input terminus and is configured to provide a quadrature phase shift such that the RF signal is split into the first RF split signal and the second RF split signal while the main RF amplification circuit is activated and the peaking RF amplification circuit is activated.

11. The RF amplification device of claim 6 wherein the Doherty amplifier is configured to provide amplification in accordance with a Doherty amplifier gain and wherein the control circuit is configured to provide the gain control signal level and the second gain control signal level such that the Doherty amplifier gain is substantially linearized while the main RF amplification circuit is activated and the peaking RF amplification circuit is deactivated.

12. The RF amplification device of claim 1 wherein:
the Doherty amplifier is configured to provide amplification in accordance to a Doherty amplifier gain; and the control circuit is configured to provide the gain control signal level that controls the peaking amplifier gain such that the Doherty amplifier gain is linearized.

13. The RF amplification device of claim 12 wherein:
the control circuit is further configured to provide the gain control signal level as a function of the instantaneous power indication signal level.

14. The RF amplification device of claim 1 wherein
the control circuit is further configured to provide the gain control signal level as a function of the instantaneous power indication signal level.

15. The RF amplification device of claim 1 wherein the peaking RF amplification circuit is configured to have an AB amplifier topology.

16. The RF amplification device of claim 15 wherein the main RF amplification circuit is configured to have an AB amplifier topology.

17. A method of amplifying an RF signal comprising:
activating a main RF amplification circuit in a Doherty amplifier so that the main RF amplification circuit amplifies the RF signal while a peaking RF amplification circuit in the Doherty amplifier is deactivated;

receiving an instantaneous power indication signal having an instantaneous power indication signal level indicative of a signal level of the RF signal;

generating a gain control signal having a gain control signal level based on the instantaneous power indication signal, wherein the gain control signal level above an activation level is in response to the instantaneous power indication signal level of the instantaneous power indication signal reaching a power threshold level; and providing the gain control signal to the peaking RF amplification circuit, wherein:
- the peaking RF amplification circuit is configured to be activated in response to the gain control signal level being above the activation level; and
- the peaking RF amplification circuit is configured to provide amplification in accordance with a peaking amplifier gain that is set based on the gain control signal level of the gain control signal.

* * * * *